US009823132B2

(12) United States Patent
Lacroix

(10) Patent No.: US 9,823,132 B2
(45) Date of Patent: Nov. 21, 2017

(54) METHOD AND APPARATUS FOR MEASURING TEMPERATURE OF SEMICONDUCTOR LAYER

(75) Inventor: Yves Lacroix, Tokushima-Shi (JP)

(73) Assignee: YSYSTEMS, LTD., Tokushima-Shi (JP)

( * ) Notice: Subject to any disclaimer, the term of this patent is extended or adjusted under 35 U.S.C. 154(b) by 800 days.

(21) Appl. No.: 14/126,010

(22) PCT Filed: Aug. 2, 2011

(86) PCT No.: PCT/JP2011/067678
§ 371 (c)(1),
(2), (4) Date: Mar. 11, 2014

(87) PCT Pub. No.: WO2013/018197
PCT Pub. Date: Feb. 7, 2013

(65) Prior Publication Data
US 2014/0192839 A1 Jul. 10, 2014

(51) Int. Cl.
G01K 7/00 (2006.01)
G01K 7/01 (2006.01)
(Continued)

(52) U.S. Cl.
CPC ............... G01K 7/01 (2013.01); C23C 16/52 (2013.01); C30B 25/16 (2013.01); G01K 11/18 (2013.01); H01L 21/67248 (2013.01)

(58) Field of Classification Search
CPC combination set(s) only.
See application file for complete search history.

(56) References Cited

U.S. PATENT DOCUMENTS 5,229,303 A 7/1993 Donnelly, Jr. et al.
5,741,070 A 4/1998 Moslehi
(Continued)

FOREIGN PATENT DOCUMENTS

CA 2748240 A1 7/2010
EP 0 429 081 5/1991
(Continued)

OTHER PUBLICATIONS

Search Report and Opinion dated Nov. 10. 2014 from European Counterpart Application No. 11870369.3.
(Continued)

Primary Examiner — Lisa Caputo
Assistant Examiner — Nasir U Ahmed
(74) Attorney, Agent, or Firm — Brinks Gilson & Lione

(57) ABSTRACT

A method and apparatus are provided to directly and accurately detect a temperature of a semiconductor layer at the time of depositing and film-forming the semiconductor layer. First wavelength laser light having light transmissivity attenuated in a first temperature range and second wavelength laser light having light transmissivity attenuated in a second temperature range are applied to the semiconductor layer. A light receiving unit receives light passing through the semiconductor layer. An attenuation range of the laser light transmissivity is detected when the temperature of the semiconductor layer is increased and the detection light quantity of the first wavelength laser light is attenuated. As the temperature continues to increase and the detection light quantity of the second wavelength laser light exceeds an attenuation start point, the temperature of the semiconductor layer is calculated based on a detection light quantity at a predetermined measurement time and the attenuation range.

10 Claims, 6 Drawing Sheets

(51) Int. Cl.
  *G01K 11/18* (2006.01)
  *C23C 16/52* (2006.01)
  *C30B 25/16* (2006.01)
  *H01L 21/67* (2006.01)

(56) References Cited

U.S. PATENT DOCUMENTS

| | | | |
|---|---|---|---|
| 5,783,804 A | 7/1998 | Burke et al. | |
| 2009/0177432 A1* | 7/2009 | Taylor, II | C23C 16/46 702/134 |
| 2009/0245320 A1* | 10/2009 | Timans | G01K 11/125 374/2 |
| 2009/0255921 A1* | 10/2009 | Ranish | H01L 21/67248 219/448.13 |
| 2011/0312107 A1* | 12/2011 | Yves | C23C 14/541 438/14 |

FOREIGN PATENT DOCUMENTS

| | | |
|---|---|---|
| JP | 3-216526 | 9/1991 |
| JP | 10160579 A | 6/1998 |
| JP | 2003-519380 | 6/2003 |
| WO | WO 01/50109 | 7/2001 |
| WO | WO 2010/073358 | 7/2010 |

OTHER PUBLICATIONS

S. R. Johnson, "Semiconductor substrate temperature measurement by diffuse reflectance spectroscopy in molecular beam epitaxy", Journal of Vacuum Science and Technology B, vol. 11, No. 3, May 1, 1993 (May 1, 1993), p. 1007, XP055148703.

K. A. Bertness, "Smart pyrometry for combined sample temperature and reflectance measurements in molecular-beam epitaxy", Journal of Vacuum Science & Technology B: Microelectronics Processing and Phenomena, American Vacuum Society, New York, N.Y., U.S., vol. 18, No. 3, May 1, 2000 (May 1, 2000), pp. 1426-1430, XP012008211.

Y. Li et al., "Simultaneous in situ measurement of substrate temperature and layer thickness using diffuse reflectance spectroscopy (DRS) during molecular beam epitaxy", Journal of Crystal Growth, Elsevier, Amsterdam, NL, vol. 175-176, No. 3001, May 1, 1997 (May 1, 1997), pp. 250-255, XP004091301.

International Search Report dated Aug. 30, 2011, prepared in International Application No. PCT/JP2011/067678.

English language translation of the International Search Report issued in International Application No. PCT/JP2011/067678.

Written Opinion of the ISA dated Sep. 13, 2011, prepared in International Application No. PCT/JP2011/067678.

\* cited by examiner ial filing date of Aug. 2,
METHOD AND APPARATUS FOR MEASURING TEMPERATURE OF SEMICONDUCTOR LAYER

RELATED APPLICATION

The present application claims the benefit under 35 U.S.C. §371 of International Patent Application No. PCT/JP2011/067678, having an internal filing date of Aug. 2, 2011, the content of which is incorporated herein by reference in its entirety.

FIELD

The present invention relates to a method and an apparatus for measuring the temperature of a semiconductor layer by which, when a semiconductor layer of a light-emitting diode or other semiconductor devices is formed by deposition, the temperature or surface roughness of the semiconductor layer can be measured during or after deposition.

BACKGROUND

Semiconductors such as AlN, GaAs, GaN, InP, Si and SiC can be formed by deposition. Examples of deposition techniques include chemical vapor deposition (CVD) and molecular beam epitaxy (MBE). In such a deposition technique, a film can be formed such that a substrate is placed in an evacuated chamber and source molecules are supplied in the form of a source gas onto the substrate to deposit a crystal layer on the surface of the substrate.

In deposition techniques of this type, the temperature of the substrate in the chamber has to be accurately controlled in order to form a high purity, high density, reproducible semiconductor crystal layer at a constant deposition rate. To this end, a monitor for measuring the temperature of the substrate in the chamber is provided along with a heater for heating the substrate, so that the heating temperature of the heater can be controlled based on the temperature measured by the monitor.

Conventionally, as described in Patent Literatures 1 and 2 cited below, a pyrometer for monitoring an infrared light that will be emitted from the surface of the heated substrate has been used as the monitor. The pyrometer is disposed outside a window of the chamber so that the infrared light emitted from the surface of the substrate or the surface of the semiconductor layer during deposition can be detected by the pyrometer through the glass window. However, the temperature monitoring by the pyrometer has the following problems.

When the infrared light emitted from the surface of the heated substrate passes through the semiconductor layer during deposition, a light passing through the semiconductor layer interferes with a light reflected inside the semiconductor layer to cause minor fluctuations of the detection output from the pyrometer, and moreover, the degree of interference varies with a change in the film thickness of the semiconductor layer during deposition. Conventionally, this problem has been solved by disposing a light emitting device outside the chamber, applying a laser light to the semiconductor layer during deposition through the glass window of the chamber, and monitoring a laser light passing through the semiconductor layer. Since the laser light passing through the semiconductor layer also interferes with a laser light reflected inside the semiconductor layer, as with the case of the infrared lights, the output fluctuations of the monitored laser light due to the interference can be used for calibration to eliminate or reduce the interference with the infrared light to be detected by the pyrometer.

However, even if the interference with the infrared light to be detected by the pyrometer can be avoided, the temperature monitoring is performed by the pyrometer at a place away from the surface of the substrate, generally, outside of the chamber through a glass window. Since not only a long distance but also the glass window exists between the substrate surface from which heat is actually emitted and the monitoring spot, it is inevitable that an error will arise between the temperature measured by the pyrometer and the actual temperature of the substrate surface.

If the semiconductor layer growing on the surface of the substrate is transparent, moreover, the pyrometer actually measures the temperature of the substrate surface through the transparent semiconductor layer. Thus, it is difficult to directly and accurately measure the temperature of the growing semiconductor layer itself by a measuring method with a pyrometer.

Patent Literature 1 cited below further discloses the use of a thermocouple monitor for measuring the temperature of the substrate at its back side. However, since the thermocouple monitor is disposed on the back side of the substrate, it is impossible to accurately measure the actual temperature of the substrate surface. In addition, since the thermocouple monitor cannot readily respond to a temperature change in the chamber because of its large heat capacity, it is difficult to accurately measure the temperature of the substrate.

Patent Literature 3 cited below further discloses a technique of irradiating a light from a halogen lamp on a wafer to be measured and calculating the surface temperature of the wafer from transmittance, reflectance and wavelength of the light.

However, since transmittance and reflectance of light vary greatly depending on various factors such as surface roughness of the wafer, it is difficult to determine the temperature of the object to be measured with high accuracy only from transmittance and reflectance of a single light.

SUMMARY OF THE INVENTION

The present invention is to solve the above-mentioned problems of the prior art and has an object to provide a method and an apparatus for measuring the temperature of a semiconductor layer by and with which the temperature of the semiconductor layer can be accurately determined during or after deposition onto a substrate, enabling deposition of a high-quality semiconductor layer.

It is another object of the present invention to provide a method and an apparatus for measuring a temperature of a semiconductor layer by which a change in the temperature of the semiconductor layer can be immediately detected by monitoring a change in the quantity of light passing through the semiconductor layer.

It is still another object of the present invention to provide a method and an apparatus for measuring a temperature of a semiconductor layer by which whether a change in the detected light quantity is due to a change in the temperature of the semiconductor layer or other factors can be determined based on a change in the light quantity detected by applying lights of different wavelengths to the semiconductor layer.

According to a first aspect of the present invention, a temperature measuring method for measuring a temperature of a semiconductor layer during deposition in a chamber comprises using a first wavelength light whose transmittance to the semiconductor layer starts to decrease as the temperature of the semiconductor layer rises and reaches a first range and a second wavelength light whose transmittance to the semiconductor layer starts to decrease as the temperature of the semiconductor layer reaches a second range that is higher than the first range, applying the first wavelength light and the second wavelength light to the semiconductor layer along a common path and detecting quantities of the first wavelength light and the second wavelength light with a light detecting device facing the semiconductor layer, and when the detected quantity of the second wavelength light starts to decrease after the temperature of the semiconductor layer exceeds the first range during which the detected quantity of the first wavelength light decreases, calculating a current temperature of the semiconductor layer within the second range from a current detected quantity of the second wavelength light and a decrease in the detected quantity of the first wavelength light.

In the temperature measuring method of the present invention, the current temperature of the semiconductor layer can be calculated such that (a maximum temperature of the second range)+(a temperature difference of the second range)×{(a decrease in the detected quantity of the second wavelength light from a decrease starting point to a current point)/(the decrease in the detected quantity of the first wavelength light)}.

In the temperature measuring method of the present invention, moreover, a temperature of the semiconductor layer during deposition can be calculated from the current detected quantity of the second wavelength light acquired during deposition of the semiconductor layer onto the substrate, and the decrease in the detected quantity of the first wavelength light, and where a heating temperature of the substrate can be controlled to keep the calculated temperature within the second range.

In the temperature measuring method of the present invention, when the semiconductor layer is being deposited on the substrate with source molecules supplied onto a heated transparent substrate in the chamber, the first wavelength light and the second wavelength light can be applied to a surface of the semiconductor layer and a diffuse reflected light passing through the semiconductor layer and a diffuse reflected light reflected from the surface of the semiconductor layer can be detected with the light detecting device facing the surface of the semiconductor layer.

In the temperature measuring method of the present invention, the temperature of the semiconductor layer can also be measured by detecting an infrared light emitted from the semiconductor layer with a temperature change measuring device, and a measurement error of the temperature change measuring device can be corrected based on the calculated current temperature within the second range.

According to a second aspect of the present invention, a temperature measuring method for measuring a temperature of a semiconductor layer during deposition in a chamber comprises using a first wavelength light whose transmittance to the semiconductor layer starts to decrease as the temperature of the semiconductor layer rises and reaches a first range and a second wavelength light whose transmittance to the semiconductor layer starts to decrease as the temperature of the semiconductor layer reaches a second range that is higher than the first range, applying the first wavelength light and the second wavelength light to the semiconductor layer along a common path and detecting quantities of the first wavelength light and the second wavelength light with a light detecting device facing the semiconductor layer, and when a change in the detected quantity of the second wavelength light is observed by monitoring the detected quantity of the second wavelength light after the temperature of the semiconductor layer exceeds the first range during which the detected quantity of the first wavelength light decreases, determining whether the change in the detected quantity of the second wavelength light is due to a change in the temperature of the semiconductor layer or other factors based on a current change in the detected quantity of the first wavelength light.

In the temperature measuring method of the present invention, when a change in the detected quantity of the first wavelength light is observed along with the change in the detected quantity of the second wavelength light, it can be determined that the change in the detected quantity of the second wavelength light is due to a factor other than a change in the temperature of the semiconductor layer.

In this case, it is also possible to calculate a surface roughness of the semiconductor layer from at least one of the change in the detected quantity of the first wavelength light or the change in the detected quantity of the second wavelength light.

In the temperature measuring method of the present invention, moreover, when a change in the detected quantity of the first wavelength light is not observed along with the change in the detected quantity of the second wavelength light, it can be determined that the change in the detected quantity of the second wavelength light is due to a change in the temperature of the semiconductor layer.

In the temperature measuring method of the present invention, when the semiconductor layer is being deposited on the substrate with source molecules supplied onto a heated transparent substrate in the chamber, the first wavelength light and the second wavelength light can be applied to a surface of the semiconductor layer and a diffuse reflected light passing through the semiconductor layer and a diffuse reflected light reflected from the surface of the semiconductor layer can be detected with the light detecting device facing the surface of the semiconductor layer.

According to a third aspect of the present invention, a temperature measuring apparatus for measuring a temperature of a semiconductor layer during deposition in a chamber comprises a light emitting device for applying a first wavelength light whose transmittance to the semiconductor layer starts to decrease as the temperature of the semiconductor layer rises and reaches a first range and a second wavelength light whose transmittance to the semiconductor layer starts to decrease as the temperature of the semiconductor layer reaches a second range that is higher than the first range, a light detecting device for detecting the first wavelength light and the second wavelength light, the light emitting device and the light detecting device facing a surface of the semiconductor layer, enabling the first wavelength light and the second wavelength light to be applied to the surface along a common path and a diffuse reflected light passing through the semiconductor layer and a diffuse reflected light reflected from the surface to be detected by the light detecting device, and a controller for calculating the temperature of the semiconductor layer from quantities of the first wavelength light and the second wavelength light detected by the light detecting device.

In the temperature measuring apparatus of the present invention, for example, when the detected quantity of the second wavelength light starts to decrease after the temperature of the semiconductor layer exceeds the first range during which the detected quantity of the first wavelength light decreases, the controller can calculate a current temperature of the semiconductor layer within the second range from a current detected quantity of the second wavelength light and a decrease in the detected quantity of the first wavelength light.

Alternatively, when a change in the detected quantity of the second wavelength light is observed by monitoring the detected quantity of the second wavelength light after the temperature of the semiconductor layer exceeds the first range during which the detected quantity of the first wavelength light decreases, the controller can determine whether the change in the detected quantity of the second wavelength light is due to a change in the temperature of the semiconductor layer or other factors based on a current change in the detected quantity of the first wavelength light.

Moreover, when there is a change in both the detected quantity of the second wavelength light and the detected quantity of the first wavelength light, the controller can calculate a surface roughness of the semiconductor layer from at least one of the change in the detected quantity of the first wavelength light or the change in the detected quantity of the second wavelength light.

With the temperature measuring method and apparatus according to the present invention, the temperature of the semiconductor layer can be immediately determined by applying lights of different wavelengths to the semiconductor layer during or after deposition.

Moreover, whether a change in the detected light quantity is due to a change in the temperature of the semiconductor layer or other factors can be determined based on a change in the light quantity detected by applying lights of different wavelengths to the semiconductor layer. This makes it possible to determine whether there is a change in the surface roughness of the semiconductor layer during deposition and also to determine the degree of surface roughness.

DETAILED DESCRIPTION OF EMBODIMENTS

Figure 1:
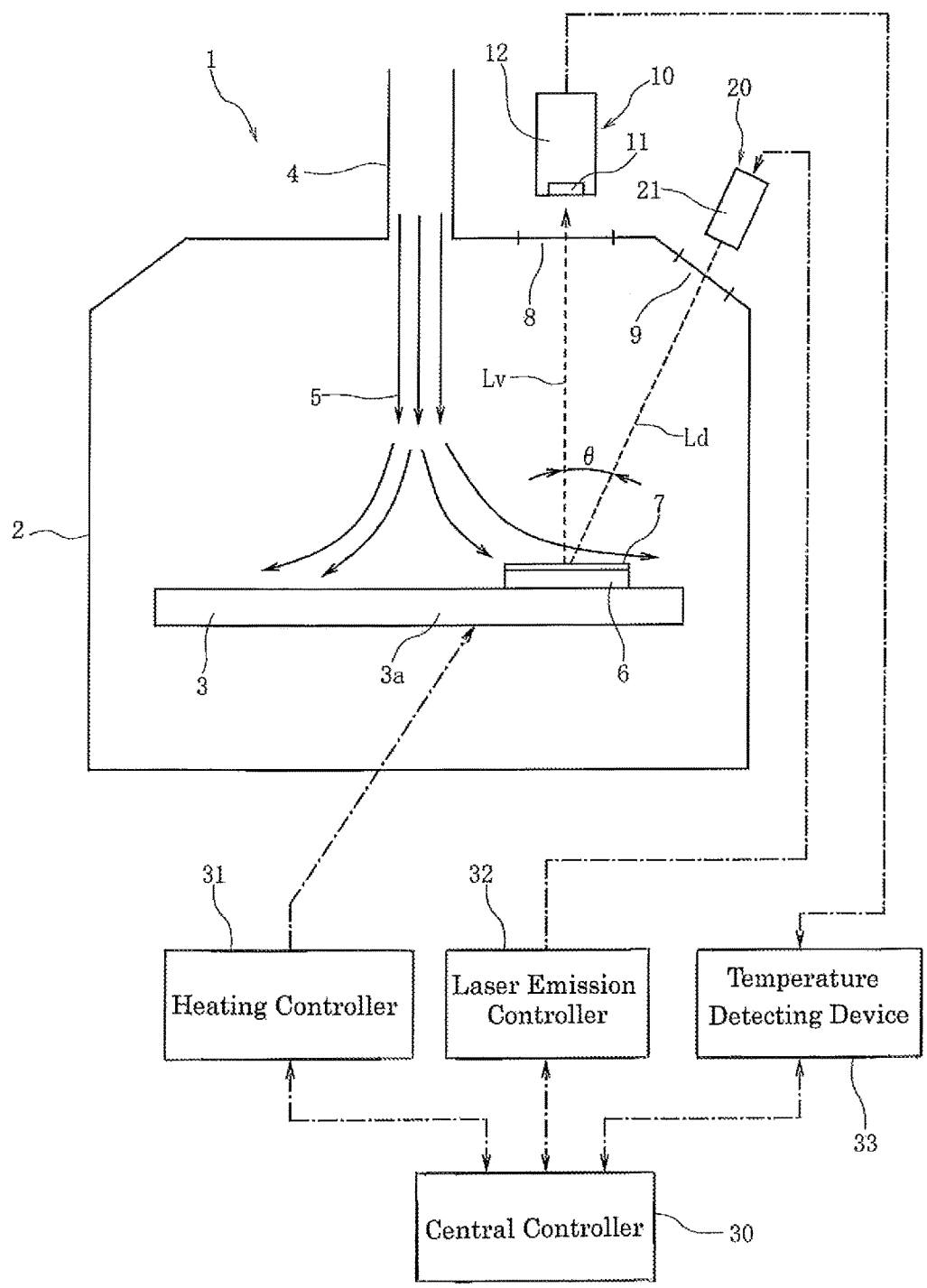
FIG. 1 is a schematic explanatory drawing showing the configuration of a film deposition apparatus and a temperature measuring apparatus according to a first embodiment of the present invention.
Figure 2:
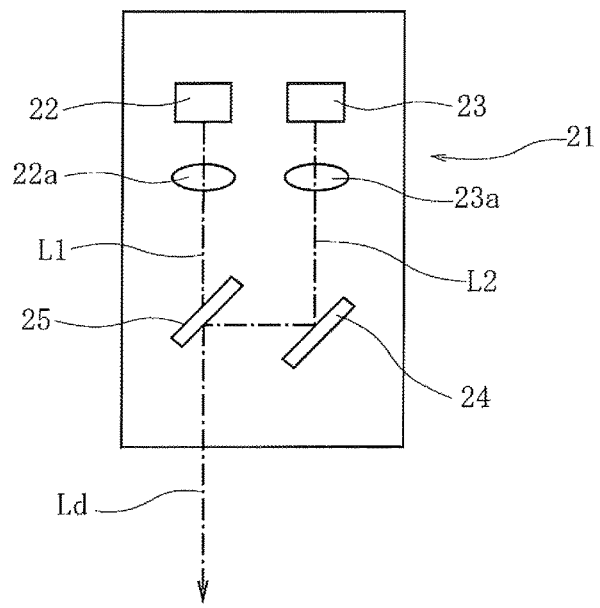
FIG. 2 is an explanatory drawing showing details of a light emitting device in the temperature measuring apparatus.
Figure 3:
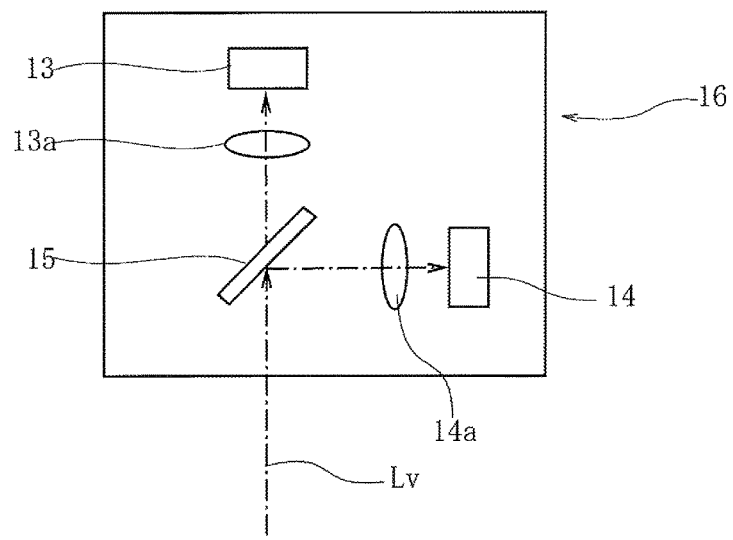
FIG. 3 is an explanatory drawing showing details of a light detecting device in the temperature measuring apparatus.

FIG. 1 is an explanatory drawing showing a film deposition apparatus 1 and a temperature measuring apparatus 20 according to a first embodiment of the present invention, FIG. 2 shows details of a light emitting device, and FIG. 3 shows details of a light detecting device.

In FIG. 1, the film deposition apparatus 1 for depositing a semiconductor layer by chemical vapor deposition (CVD) or molecular beam epitaxy (MBE) is illustrated in a schematic drawing.

The film deposition apparatus 1 has a chamber 2 that can be evacuated during deposition. A table 3 is disposed in the chamber 2, and a heater 3a is incorporated in the table 3 as a heating device. A feed port 4 is connected to the chamber 2, through which a source gas 5 containing elements (source molecules) for deposition of a semiconductor layer 7 is supplied to the surface of the table 3, thereby depositing the semiconductor layer 7 on the surface of a substrate 6 disposed on the table 3.

The chamber 2 has a first window 8 and a second window 9. Transparent plates such as glass plate are inserted in the first window 8 and the second window 9 so that the inside can be observed through the transparent plate, but the interior space of the chamber 2 is separated from the exterior space by the transparent plate.

Outside the first window 8, a pyrometer 10 is provided as an example of a temperature change measuring device. The pyrometer 10 has a light receiver 11 and a processing circuit 12 which processes light output received by the light receiver 11. The light receiver 11 of the pyrometer 10 is located outside the first window 8 at a normal angle to the surface of the substrate 6, looking through the transparent plate inserted in the first window 8. The axis of the light receiver 11 lies on a perpendicular line Lv extending perpendicularly from the center of the surface of the substrate 6, and where a light receiving element inside the light receiver 11 is facing the surface of the substrate 6 with its optical axis parallel to the perpendicular line Lv.

When the table 3 and the substrate 6 are heated by the heater 3a, an infrared light emitted from the heated surface of the table 3 passes through the transparent substrate 6 and the semiconductor layer 7 during deposition and is received by the light receiver 11 through the first window 8. The light output received by the light receiver 11 is sent to the processing circuit 12, so that the surface temperature of the substrate 6, more precisely, the surface temperature of the table 3 can be determined from the wavelength of the received infrared light.

Outside the chamber 2, a light emitting device 21 is provided as a constituent part of the temperature measuring apparatus 20 according to the embodiment of the present invention. The light emitting device 21 is located outside the second window 9 of the chamber 2, facing the surface of the substrate 6.

As shown in FIG. 2, the light emitting device 21 has a first laser beam source 22 which emits a laser beam L1 of a first wavelength and a second laser beam source 23 which emits a laser beam L2 of a second wavelength. The laser beam L1 emitted from the first laser beam source 22 is converted to a collimated light through a collimator lens 22a and then passes through a half mirror 25. The laser beam L2 emitted from the second light source 23 is converted to a collimated light through a collimator lens 23a and then reflected by a mirror 24 to the half mirror 25.

In the light emitting device 21, the first laser beam source 22 and the second laser beam source 23 are alternately turned on and off so that the first laser beam L1 and the second laser beam L2 can be alternately applied to the substrate 6 and the semiconductor layer 7 along a common path Ld.

Figure 4:
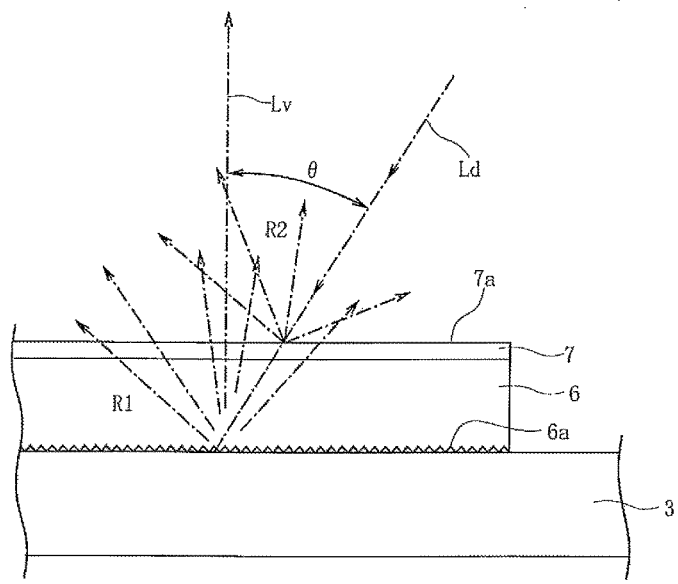
FIG. 4 is an enlarged explanatory drawing showing a substrate and a semiconductor layer during or after deposition in the film deposition apparatus.

The substrate 6 is made of a transparent materials such a sapphire wafer. In this context, "transparent" means having a total light transmittance of 80% or above as optical property, ideally, a total light transmittance of 95% or above. As shown in FIG. 4, a bottom surface 6a of the substrate 6 is slightly rough, diffusing the reflected light at its surface. When the light transmission of the semiconductor layer 7 is high, the laser beam irradiated along the path Ld can be diffusely reflected from the bottom surface 6a after passing through the semiconductor layer 7 and the substrate 6. The diffuse reflected light R1 from the bottom surface 6a passes through the substrate 6 and the semiconductor layer 7, and a component of the diffuse reflected light R1 directed along the perpendicular line Lv can be received by the light receiver 11.

Since the laser beam travelling along the path Ld enters the surface 7a of the semiconductor layer 7 at an incidence angle θ, the light specularly reflected from the surface 7a at the reflection angle θ cannot be received by the light receiver 11. However, if the laser beam is diffusely reflected from the surface 7a of the semiconductor layer 7, a component part of the diffuse reflected light R2 directed along the perpendicular line Lv can be received by the light receiver 11.

The angle θ which the path Ld makes with the perpendicular line Lv is greater than 0 degree and less than 90 degrees.

The light receiver 11 is not only used for the pyrometer 10 to receive an infrared light but also serves as a light detecting device which receives a laser light diffusely reflected from the bottom surface 6a and the surface 7a. In the light receiver 11, the infrared light emitted from the heated substrate 6 and the semiconductor layer 7 and the diffuse reflected lights R1, R2 of the laser beam reflected from the substrate 6 and the semiconductor layer 7 can be detected alternately in time. Moreover, light detection signals at the light receiver 11 are divided in synchronization with the emission of the two laser beam sources 22, 23, so that the first laser beam L1 and the second laser beam L2 can be detected at different times. Therefore, in the light receiver 11, the infrared light, the first laser beam L1 and the second laser beam L2 can be separately detected without interfering with each other.

Alternatively, a light detecting device 16 which receives a laser beam may be provided separately from the light receiver 11 of the pyrometer 10 which receives an infrared light, and the light receiver 11 and the light detecting device 16 may be arranged side by side outside the first window 8.

In this case, as shown in FIG. 3, the light detecting device 16 may be configured to include a first light receiving element 13, a condenser lens 13a for concentrating a reflected light to the first light receiving element 13, a second light receiving element 14, a condenser lens 14a for concentrating a reflected light to the second light receiving element 14, and a wavelength filter 15. In the light detecting device 16, the diffuse reflected lights R1, R2 entering along the perpendicular line Lv can be split by the wavelength filter 15, so that the diffuse reflected light of the first laser beam L1 can be received by the first light receiving element 13 while the diffuse reflected light of the second laser beam can be received by the second light receiving element 14.

When using the light detecting device 16 shown in FIG. 3, even if the first laser beam source 22 and the second laser beam sources 23 are simultaneously activated to continuously emit light in the light emitting device 21 shown in FIG. 2, the diffuse reflected light of the first laser beam L1 and the diffuse reflected light of the second laser beam L2 can be separated from each other with the wavelength filter 15, so that the laser lights of different wavelengths can be separately received by the first light receiving element 13 and the second light receiving element 14.

As shown in FIG. 1, the film deposition apparatus 1, the pyrometer 10 and the light emitting device 21 are controlled by a central controller 30. The central controller 30 comprises a microcomputer, a memory and so on. A heating controller 31 receives an instruction from the central controller 30 and controls electric supply to the heater 3a, thereby controlling the heating temperature of the table 3. A laser emission controller 32 receives an instruction from the central controller 30 and controls the light emitting device 21.

An output signal of the pyrometer 10 is sent to a temperature detecting device 33. The temperature detecting device 33 receives the output signal, which is correlated to the infrared light emitted from the table 3, determines the surface temperature of the table 3 from the wavelength of the infrared light or the like, and sends its temperature information to the central controller 30. In addition, the diffuse reflected light R1 of the laser beam diffusely reflected from the bottom surface 6a of the substrate 6 and the diffuse reflected light R2 of the laser beam diffusely reflected from the surface 7a of the semiconductor layer 7 are received by the light receiver 11 or the light detecting device 16 shown in FIG. 3, and an output signal correlated to the amount of light detected is also sent to the temperature detecting device 33, and its information is sent to the central controller 30.

Next will be described the principle of the method for measuring the temperature of the semiconductor layer using the measuring apparatus 20.

In the film deposition apparatus 1 shown in FIG. 1, the source gas 5 is introduced into the chamber 2 while the table 3 and the substrate 6 are being heated by the heater 3a, whereby the semiconductor layer 7 grows on the surface of the transparent substrate 6, as shown in FIG. 4.

The semiconductor layer 7 deposited on the surface of the substrate 6 serves as a monolayer in a light-emitting diode or other types of semiconductor elements and includes AlN, GaAs, GaN, InP, Si or SiC, for example.

Figure 5:
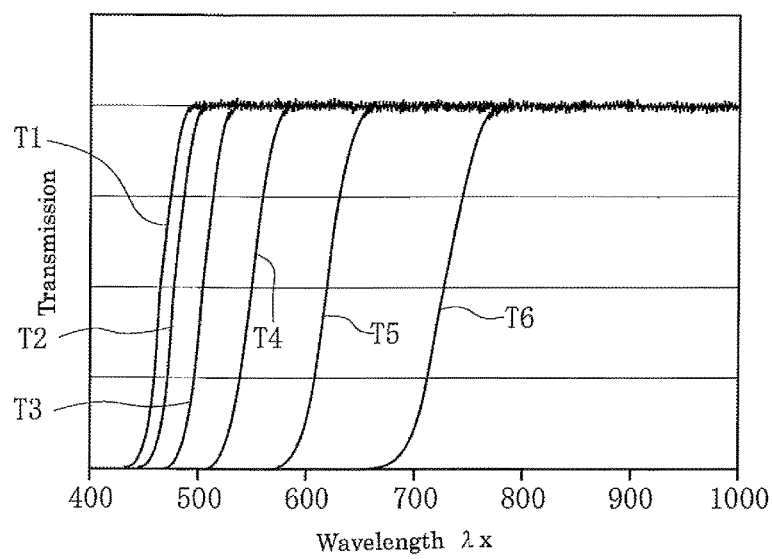
FIG. 5 is a diagram showing a relationship between the wavelengths of light applied to the semiconductor layer, the light transmittance and the temperature of the semiconductor layer.

In such semiconductor layers, the light transmittance varies depending on the wavelength of light and the temperature of the semiconductor layer. In FIG. 5, the abscissa represents the wavelength λx of light applied to the semiconductor layer, while the ordinate represents the light transmittance in the semiconductor layer. In FIG. 5, the temperature of the same semiconductor layer is varied stepwise from T1 to T6 (T1<T2<T3<T4<T5<T6). As shown in FIG. 5, when the light applied to the semiconductor layer has a given wavelength λx, the light transmittance decreases with an increase in the temperature. In addition, as the temperature of the semiconductor layer increases, the temperature at which the transmittance starts to decrease varies depending on the wavelength λx of the light applied to the semiconductor layer.

Figure 6:
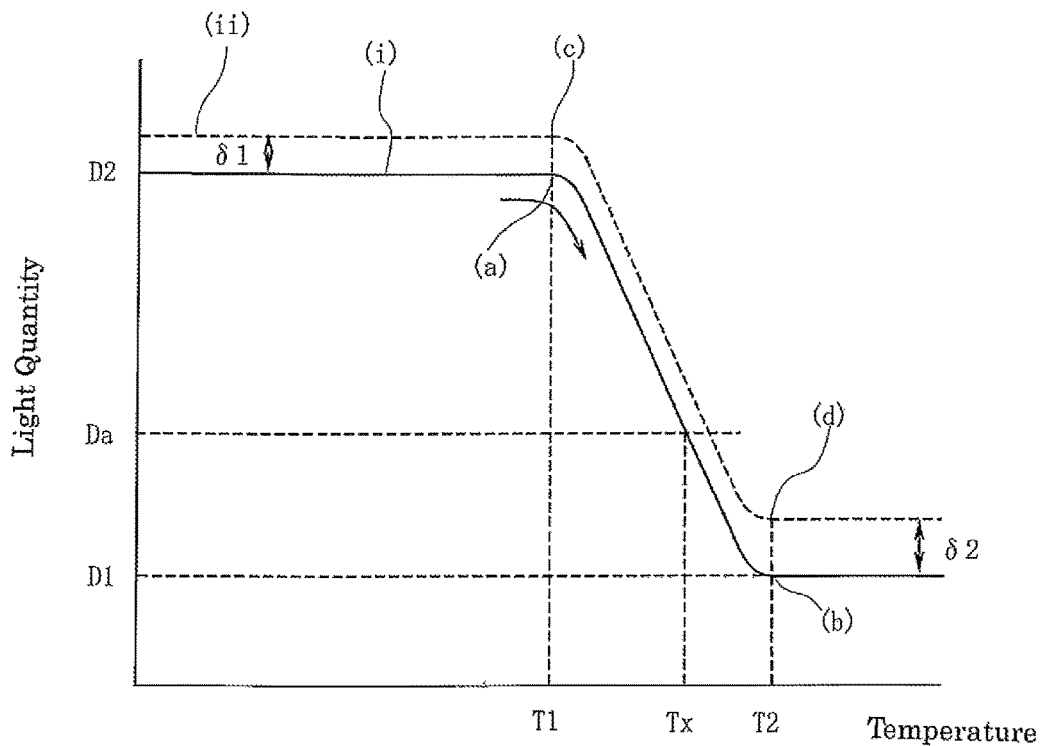
FIG. 6 is a diagram showing a relationship between the transmission quantity of light applied to the semiconductor layer and the temperature of the semiconductor layer.

As a comparative example of the temperature measuring method according to the embodiment of the present invention, FIG. 6 shows a temperature measuring method in which a single laser beam of a given wavelength λ1 is applied along the path Ld during deposition of the semiconductor layer 7 onto the surface of the substrate 6 in the film deposition apparatus 1. In FIG. 6, the abscissa represents the temperature of the semiconductor layer 7, while the ordinate represents the change in the detected light quantity when the diffusely reflected light of the laser beam from the bottom surface 6a of the substrate 6 and the surface 7a of the semiconductor layer 7 is received by the light receiver 11.

As shown in FIG. 6, the changes in curve (i) represent a relationship between the change in the temperature of the semiconductor layer 7 and the light quantity detected by the light receiver 11 in an almost ideal condition without any diffuse reflected light R2 from the surface 7a of the semiconductor layer 7 or the like.

As indicated by the changes in curve (i), when the temperature of the semiconductor layer 7 is low, the semiconductor layer 7 has a high light transmission, so that the diffuse reflected light R1 reflected from the bottom surface 6a of the substrate 6 as shown in FIG. 4 passes through the semiconductor layer 7 at a high rate. Consequently, a large quantity of the diffuse reflected light of the laser beam can be received by the light receiver 11, and the detected light quantity becomes D2. When the temperature of the semiconductor layer 7 rises and reaches T1, the light transmittance of the semiconductor layer 7 starts to decrease, so that the quantity of the diffuse reflected light received by the light receiver 11 starts to decrease from D2. When the temperature of the semiconductor layer 7 rises to T2, the light transmittance of the semiconductor layer 7 becomes minimum, so that the detected quantity of the diffuse reflected light received by the light receiver 11 decreases to D1.

In this description, a point (a) where the quantity of the diffuse reflected light detected by the light receiver 11 starts to decrease with an increase in the temperature of the semiconductor layer 7 is referred to as the "decrease starting point" and the detected light quantity D2 at the decrease starting point (a) is referred to as the "maximum detected light quantity". On the other hand, a point (b) where the decrease in the quantity of the diffuse reflected light detected by the light receiver 11 ends is referred to as the "decrease ending point" and the detected light quantity D1 at the decrease ending point (b) is referred to as the "minimum detected light quantity".

In an actual film deposition process of the semiconductor layer 7, the optical properties of the substrate 6 and the semiconductor layer 7 easily vary depending on temperature conditions as well as the direction and roughness of the surface 7a of the semiconductor layer 7 easily vary. In addition, when the substrate 6 is placed in the chamber 2, an error easily arises in the angle between the surface 6a of the substrate 6 and the perpendicular line Lv. As the properties of diffused reflection of the laser beam vary with these various conditions, even if the light transmittance of the same semiconductor layer 7 is measured by using the same laser beam of wavelength λ1, the change in the light quantity detected by the light receiver 11 cannot follow the ideal curve (i) shown in FIG. 6, but will include the offset quantities δ1 and δ2, as shown by the dotted curve (ii).

However, even if the conditions for diffused reflection of the laser beam from the substrate 6 or the semiconductor layer 7 vary, the relationship between the wavelength and the transmittance of light and the relationship with the current temperature remain the same as long as a laser beam of the same wavelength is irradiated on a semiconductor layer of the same material, as shown in FIG. 5. Accordingly, the temperature of the semiconductor layer 7 is T1 not only at the decrease starting point (a) of the curve (i) but also at a decrease starting point (c) of the curve (ii), and the temperature of the semiconductor layer 7 is T2 not only at the decrease ending point (b) of the curve (i) but also at a decrease ending point (d) of the curve (ii).

In other words, although the light transmittance of the semiconductor layer 7 does not vary as long as the temperature and the wavelength remain the same, the quantity of the diffused reflected light of the laser beam detected by the light receiver 11 varies according to various optical conditions other than the transmittance such as diffused reflection conditions.

In the temperature measuring method using a single laser beam of a wavelength λ1, if the curve shown in FIG. 6 is obtained by increasing the temperature of the semiconductor layer 7 during deposition to a value higher than the temperature T2 corresponding to the decrease ending point, as shown in FIG. 6, then, the temperature of the semiconductor layer 7 between T1 and T2 can be calculated by monitoring a detected light quantity Da. Once a relationship between the maximum value D2, the minimum value D1 and the temperatures T2, T1 in the variation of the curve (i) is found by raising the temperature of the semiconductor layer 7 above T2, for example, the current temperature Tx of the semiconductor layer 7 can be calculated from the monitored value Da of the detected light quantity according to the following equation:

$$Tx=T1+(T2-T1)\times\{(D2-Da)/(D2-D1)\}.$$

However, if the temperature is not raised to T2 or the relationship between (T2−T1) and (D2−D1) is unknown, the temperature Tx between T2 and T1 cannot be calculated from the monitored value of the temperature during deposition, so that it is impossible to perform the control to keep the temperature of the semiconductor layer 7 at Tx.

In the method for measuring the temperature of the semiconductor layer using the measuring apparatus 20 according to the embodiment of the present invention, however, since at least two types of laser beams having different wavelengths are used, the temperature Tx between T2 and T1 can be calculated from the monitored value of the light quantity of the laser beam detected by the light receiver 11 without raising the temperature of the semiconductor layer 7 above T2.

In the film deposition apparatus 1 shown in FIG. 1, the first laser beam L1 is emitted from the first laser beam source 22 of the light emitting device 21 shown in FIG. 2, while the second laser beam L2 is emitted from the second light source 23, and these laser beams L1, L2 are applied to the semiconductor layer 7 along the same path Ld.

Figure 7:
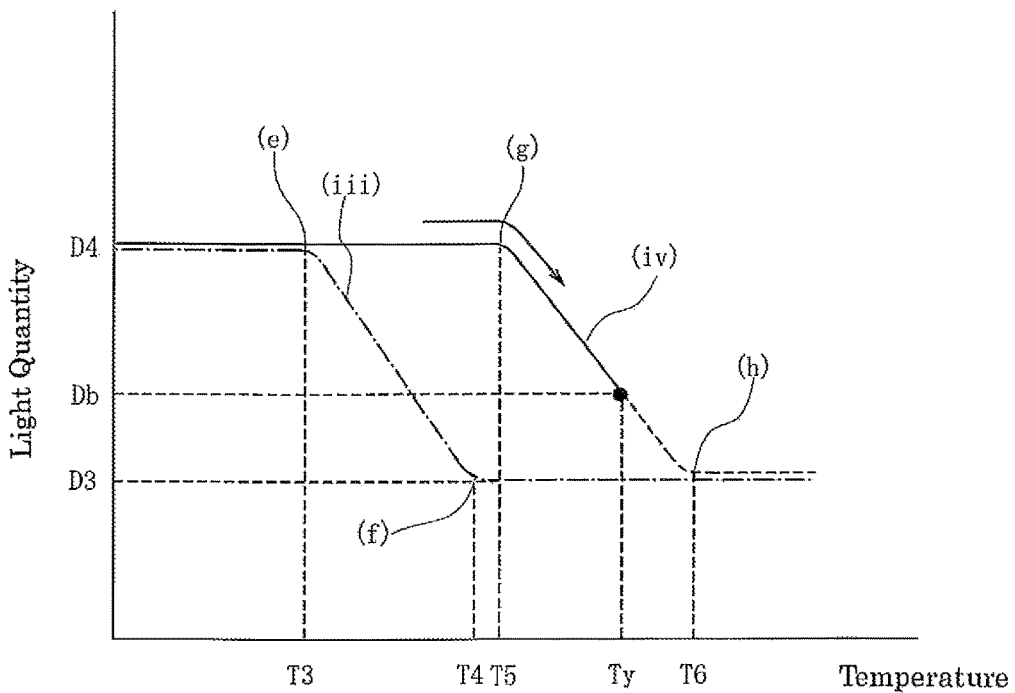
FIG. 7 is a diagram showing a relationship between the transmission quantity of two lights of different wavelengths applied to the semiconductor layer and the temperature of the semiconductor layer.

A curve (iii) shown in FIG. 7 represents a relationship between the detected light quantity and the temperature of the semiconductor layer 7 when the first laser beam L1 is applied to the semiconductor layer 7 placed on the substrate 6 and the diffuse reflected lights R1, R2 are received by the light receiver 11, while a curve (iv) represents a relationship between the detected light quantity and the temperature of the semiconductor layer 7 when the second laser beam L2 is applied to the semiconductor layer 7 placed on the substrate 6 and the diffuse reflected lights R1, R2 are received by the light receiver 11.

The wavelength of the first laser beam L1 is selected such that the temperature of the semiconductor layer 7 is T3 at a decrease starting point (e) and T4 at a decrease ending point (f). The wavelength of the second laser beam L2 is selected such that the temperature is T5 at a decrease starting point (g) and T6 at a decrease ending point (h). The range from the temperature T3 to T4 is a first temperature range in which the light transmission quantity of the first laser beam L1 decreases, while the range from the temperature T5 to T6 is a second temperature range in which the light transmission quantity of the second laser beam L2 decreases. The second temperature range is higher than the first temperature range.

As shown in FIG. 5, depending on the type of material, the semiconductor layer 7 has a certain relationship between the transmittance and the wavelength for each temperature, so that the first temperature range can be set by selecting the wavelength of the first laser beam L1 depending on the material of the semiconductor layer 7, and in the same fashion the second temperature range can be set by selecting the wavelength of the second laser beam L2 depending on the material.

Since the first laser beam L1 and the second laser beam L2 are applied to the semiconductor layer 7 along the same path Ld, the first laser beam L1 and the second laser beam L2 are equally subjected to the influence of transmission and reflection properties of light, e.g., the influence of the diffused reflection from the bottom surface 6a of the substrate 6, the influence of the surface roughness at the surface 7 of the semiconductor layer 7, and the error in the angle between the surface 7a of the semiconductor layer 7 and the perpendicular line Lv. Consequently, the ratio of the changes δ1, δ2 in the detected light quantity shown in FIG. 6 does not vary between the first laser beam L1 and the second laser beam L2.

Therefore, if the light emitting device 21 has the same emission intensity for both the first laser beam L1 and the second laser beam L2 and the light receiver 11 has the same photosensitivity for both the first laser beam L1 and the second laser beam L2, both maximum of detected light quantity associated with the first laser beam L1 and the second laser beam L2 become D4, as shown in FIG. 7, and in the same way, the decrease of light quantity of the first laser beam L1 and the decrease of light quantity of the second laser beam L2 are equal and become (D4−D3).

In practice, however, since the emission intensity differs between the two laser beams and the light reception sensitivity also differs between these laser beams, it is necessary to perform some calibrations before performing the film deposition in the apparatus 1.

An example of calibration is such that the substrate 6, on which a sample of the semiconductor layer has been previously deposited, is placed on the table 3 in the chamber 2, and where the temperature of the substrate 6, as well as that of the semiconductor layer 7 is gradually increased under monitoring with the pyrometer 10, while the first laser beam L1 and the second laser beam L2 are applied to the sample of the semiconductor layer. A change in the detected light quantity of the first laser beam L1 is measured as the temperature exceeds the first temperature range (T3-T4), and a change in the detected light quantity of the second laser beam L2 is measured as the temperature exceeds the second temperature range (T5-T6). Based on these measured values, software or hardware adjustments are performed such that a decrease in the detected light quantity of the first laser beam L1 in the first temperature range becomes equal to a decrease in the detected light quantity of the second laser beam L2 in the second temperature range.

Another example of calibration is as follows. In the case where the semiconductor layer 7 has not been deposited on the transparent substrate 6 in the chamber 2, the laser beam is emitted from the first laser beam source 22 shown in FIG. 2 and the diffused reflection of the first laser beam L1 from the bottom surface 6a of the substrate 6 and from the surface of the substrate 6 is detected by the light receiver 11. Then, the laser beam is emitted from the second laser beam source 23 and the diffused reflection of the second laser beam L2 from the bottom surface 6a of the substrate 6 and from the surface of the substrate 6 is detected by the light receiver 11. Finally, the calibration is performed by software or hardware adjustments such that the light quantity detected when the laser beam is emitted from the first laser beam source 22 becomes equal to the light quantity detected when the laser beam is emitted from the second laser beam source 23.

In the film deposition apparatus 1 thus calibrated, the temperature Ty in the second temperature range between the temperatures T5 and T6 can be immediately calculated from the monitored value of the light quantity of the laser beam detected by the light receiver 11, where the temperature of the semiconductor layer 7 need not be raised above T6 shown in FIG. 7.

As shown in FIG. 7, as the temperature of the semiconductor layer 7 rises, the detected light quantity of the first laser beam L1 passes through the decrease starting point (e) and reaches the decrease ending point (f), as indicated by the curve (iii). At this point, the detected light quantity of the second laser beam L2 has not yet started to decrease, as shown by the curve (iv). When the detected light quantity of the first laser beam L1 has passed through the decrease ending point (f), the decrease (D4−D3) in the detected light quantity of the first laser beam L1 can be determined by the processing circuit 12 of the light receiver 11 and sent to the central controller 30 for storage through the temperature detecting device 33.

Thereafter, as the temperature of the semiconductor layer 7 rises, the detected light quantity of the second laser beam L2 reaches the decrease starting point (g) and starts to decrease. At this time, since the decrease (D4−D3) in the detected light quantity of the first laser beam L1 has been already found, the temperature Ty of the semiconductor layer 7 can be calculated by the central controller 30 from a monitored value Db that is obtained when the detected light quantity of the second laser beam L2 has passed through the decrease starting point (g) but not yet reached the decrease ending point (h) and the decrease (D4−D3) in the first laser beam L1 according to the following equation:

$$Ty = T5 + (T6-T5) \times \{(D4-Db)/(D4-D3)\}.$$

That is, the current temperature of the semiconductor layer 7 can be calculated such that (the maximum temperature of the second range)+(the temperature difference of the second range)×{(the decrease in the transmission quantity of the second wavelength light from the decrease starting point to the current point)/(the decrease in the detected quantity of the first wavelength light)}.

Accordingly, as the temperature of the semiconductor layer 7 rises, the temperature of the semiconductor layer 7 can be controlled to be the temperature Ty between the temperatures T5 and T6 by monitoring the temperature after the second laser beam L2 has passed through the decrease starting point (g).

The relationship between the light transmittance and the current temperature in the case where the second laser beam L2 is irradiated on the semiconductor layer 7 can be established depending on the relationship between the material of the semiconductor and the wavelength of the laser beam L2. When the semiconductor layer 7 is made of GaN (gallium nitride) and the wavelength of the second laser beam L2 is 445 nm, for example, the temperature T5 at the decrease starting point (g) can be set at about 800° C. and the temperature T6 at the decrease ending point (h) can be set at about 900° C. In this case, the temperature at which occurs the deposition of the semiconductor layer 7 can always be controlled to be a certain temperature between 800° C. and 900° C.

It should be noted that the wavelength of the first laser beam L1 can be selected from a relatively wide range as long as the temperature T4 at the decrease ending point (f) is lower than the temperature T5 at the decrease starting point (g) of the second laser beam L2.

In the film deposition apparatus 1 shown in FIG. 1, the temperature of the semiconductor layer 7 is indirectly measured such that the infrared light emitted from the substrate 6 and the surface of the semiconductor layer 7 is detected by the pyrometer 10, which is an example of the temperature change measuring device, and an output signal correlated to the infrared light is sent to the temperature detecting device 33. The temperature information acquired by the detection of the infrared light at the pyrometer 10 can be corrected by comparing the temperature information with the temperature calculated by using the first laser beam L1 and the second laser beam L2. It is also possible to perform the temperature control with higher accuracy based on the temperature calculated by using the first laser beam L1 and the second laser beam L2 and the temperature information acquired by the detection of the infrared light.

Figure 8:
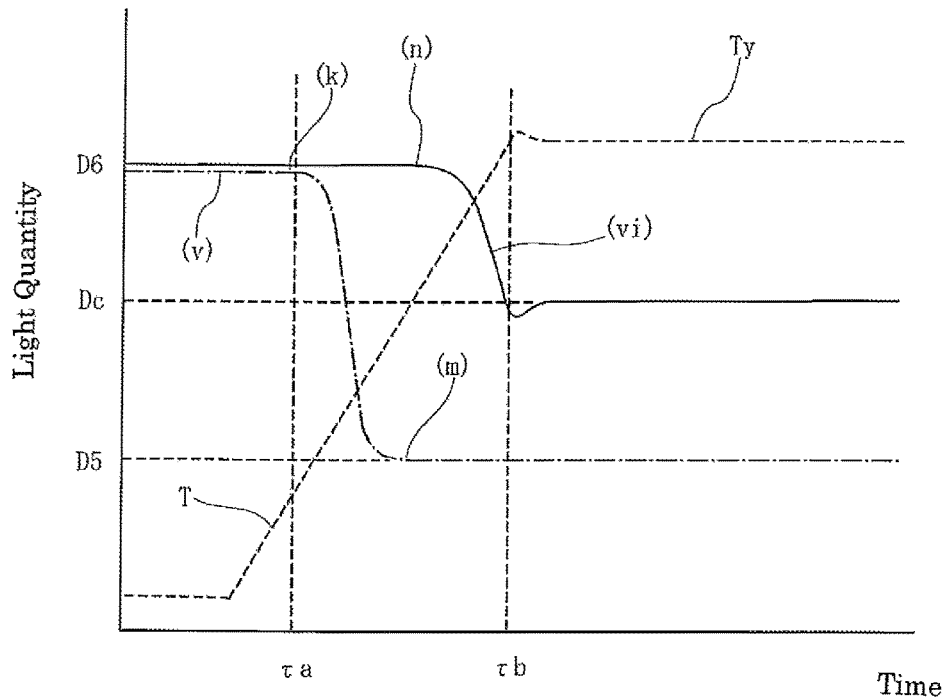
FIG. 8 is a diagram showing a change in the transmittance of two lights of different wavelengths when the temperature of the semiconductor layer is being controlled.

FIG. 8 shows a temperature control method for controlling the temperature of the semiconductor layer 7 to be a certain temperature Ty within the second temperature range (T6-T5) during deposition of the semiconductor layer 7 in the chamber 1.

In FIG. 8, a dotted line T represents a change in the temperature of the semiconductor layer 7 during deposition onto the substrate 6. A curve (v) represents a change in the light quantity of the first laser beam L1 detected by the light receiver 11, while a curve (vi) represents a change in the light quantity of the second laser beam L2 detected by the light receiver 11.

When the semiconductor layer 7 is being deposited with the source gas 5 introduced into the chamber 2, the heater 3a is controlled to raise the temperature T of the semiconductor layer 7. The detected light quantity of the first laser beam L1 reaches a decrease starting point (k) at a time τa and then reaches a decrease ending point (m), and thus, a decrease (D6-D5) of the first laser beam L1 can be determined when the temperature of the semiconductor layer 7 exceeds the first temperature range.

Once the detected light quantity of the second laser beam L2 passes through a decrease starting point (n) along with a further rise in the temperature of the substrate 6 and the semiconductor layer 7, it becomes possible to immediately calculate the actual temperature of the semiconductor layer 7 from the monitored value of the received light quantity of the second laser beam L2 by the light receiver 11 and the previously determined decrease (D6-D5) of the first laser beam L1. Accordingly, once the detected light quantity of the second laser beam L2 reaches Dc between D6 and D5 at a time Tb, the temperature of the semiconductor layer 7 can be maintained at an optimum temperature Ty for deposition in the second temperature range (T5-T6) by controlling the heater 3a with the heating controller 31 and keeping the monitored value of the detected light quantity at Dc.

As shown in FIG. 8, once the decrease (D6-D5) in the detected light quantity of the first laser beam L1 is determined, the temperature of the semiconductor layer 7 can be maintained at the optimum temperature Ty for deposition by monitoring the detected light quantity of the second laser beam L2 without the need to raise the temperature of the semiconductor layer 7 above the second temperature range.

Figure 9:
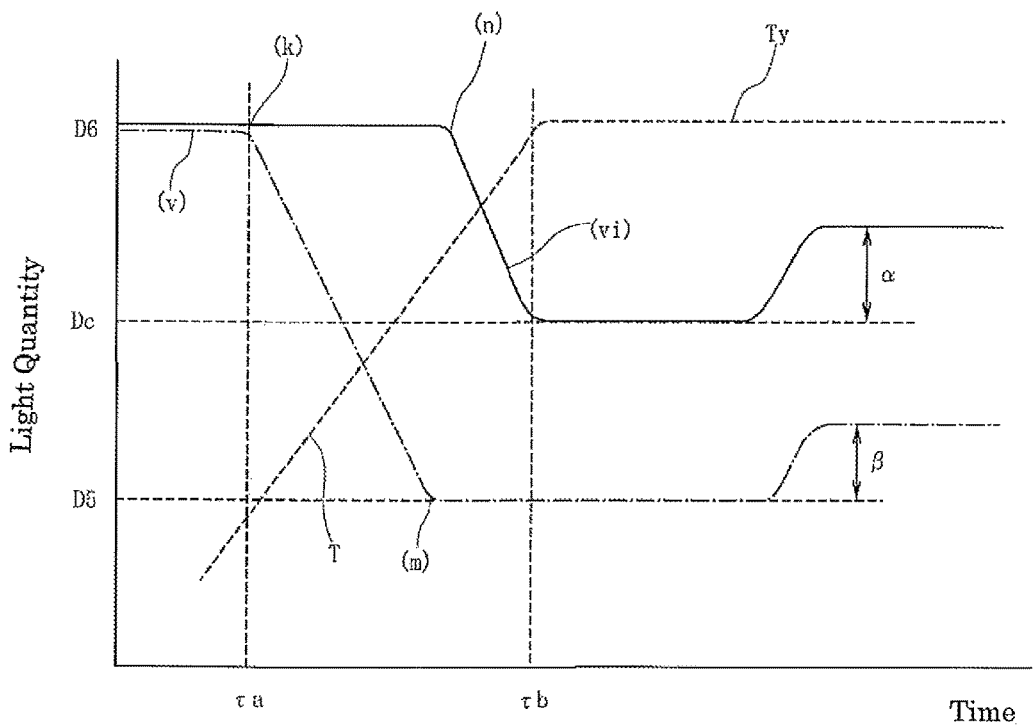
FIG. 9 is a diagram showing a case where a factor other than temperature change has caused a change in the transmittance of the semiconductor layer.
Figure 10:
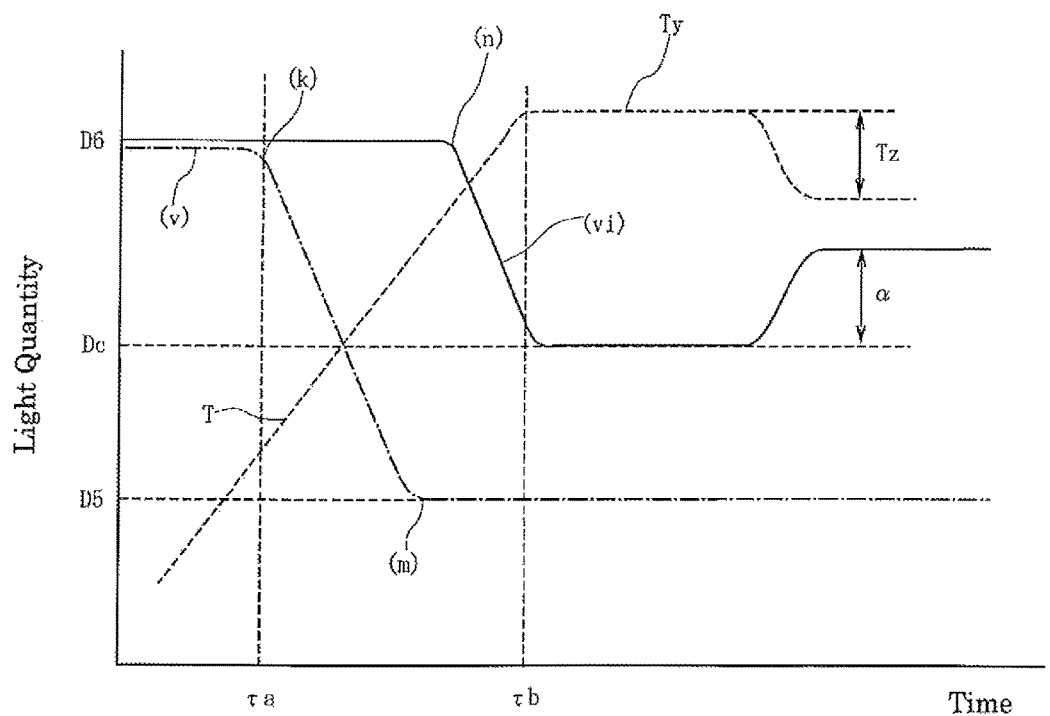
FIG. 10 is a diagram showing a case where a change in the temperature of the semiconductor layer has caused a change in the transmittance.

FIGS. 9 and 10 show a case where although the temperature of the semiconductor layer 7 is being controlled to be the optimum value Ty after the time τb, a change has occurred in the light quantity detected by the light receiving element 11.

In the case shown in FIG. 9, the detected light quantity of the second laser beam L2 does not stay at Dc and varies as indicated by a during the temperature control after the time Tb. At the same time, the detected light quantity of the first laser beam L1 does not stay at the minimum value D5, either, and has a change β similar to α. When the detected light quantity of the first laser beam L1 and the detected light quantity of the second laser beam L2 vary in a similar manner, as described above, it can be determined that a change has occurred in the laser beam incidence reflection conditions of the semiconductor layer 7, e.g., that a change has occurred in the diffuse reflected light R2 because of a change in the surface roughness at the surface 7a of the semiconductor layer 7.

On the other hand, if the detected light quantity of the second laser beam L2 has a change α but the detected light quantity of the first laser beam L1 does not show any changes after the decrease ending point (m), as shown in FIG. 10, it can be determined that this change is not due to a variation of the light transmission conditions or reflection conditions for the two laser beams of different wavelengths, but due to a real change of temperature Tz at the semiconductor layer 7.

That is, once the detected light quantity of the first laser beam L1 passes through the decrease ending point (m), it becomes possible to determine whether a change has occurred in the temperature of the semiconductor layer 7 or an optical change has occurred in the semiconductor layer 7 by monitoring both the detected light quantity of the first laser beam L1 and the detected light quantity of the second laser beam L2.

For instance, the diffuse reflected light R2 from the surface 7a may increase because of surface roughness caused by partial evaporation of the surface 7a during the deposition of the semiconductor layer 7, but this phenomenon can be detected by the foregoing monitoring, and the occurrence of surface roughness at the surface 7a can be suppressed by controlling the introduction amount of the source gas 5 and the heating temperature. It is also possible to purposely impart surface roughness to the surface 7a of the semiconductor layer 7 by controlling them.

In addition, if a relationship between at least one of a change α in the detected light quantity of the first laser beam L1 or a change β in the detected light quantity of the second laser beam L2 and the degree of surface roughness or an acceptable range of surface roughness at the surface 7a of the semiconductor layer 7 has been previously found and its function is stored in the central controller 30, the surface roughness at the surface 7a of the semiconductor layer 7 can be calculated when the changes α, β appear in the detected light quantity, as shown in FIG. 9. For example, the degree of surface roughness at the surface 7a of the semiconductor layer 7 can be determined from a ratio of the maximum value D6 of the detected light quantity to the magnitude of the changes α, β or a ratio of the change (D6-D5) in the detected light quantity to the magnitude of the changes α, β. With this, the degree of actual surface roughness can be estimated numerically or used for relatively rough determination of whether the surface roughness is within an acceptable range or not.

In the temperature measuring apparatus and method according to the present invention, it is also possible that the light detecting device 10 is opposed to the surface of the substrate 6 in the same manner as in FIG. 1, whereas the light emitting device 21 which emits the laser beams L1, L2 of different wavelengths is opposed to the bottom surface of the substrate 6. In this case, after having entered the bottom surface 6a of the substrate 6 and passed through the substrate 6 and the semiconductor layer 7, the first laser beam L1 and the second laser beam L2 can be received by the light receiver 11.

Also in this case, the temperature of the semiconductor layer 7 can be measured as needed despite any optical changes other than a change in the light transmittance of the semiconductor layer such as the surface roughness at the surface of the semiconductor layer 7, which are canceled by using the laser beams L1 and L2 of different wavelengths, as in the first embodiment.

REFERENCE SIGNS LIST

1 Film Deposition Apparatus
2 Chamber
3 Table
6 Substrate
7 Semiconductor Layer
8 First Window
9 Second Window
10 Pyrometer
11 Light Receiver
13 First Light Receiving Element
14 Second Light Receiving Element
15 Wavelength Filter
16 Light Detecting Device
20 Temperature Measuring Apparatus
21 Light Emitting Device
22 First Laser Beam Source
23 Second Laser Beam Source
L1 Laser Beam of First Wavelength
L2 Laser Beam of Second Wavelength
T3-T4 First Temperature Range
T5-T6 Second Temperature Range
(e), (g) Decrease Starting Point
(f), (h) Decrease Ending Point

The invention claimed is:

1. A temperature measuring method for measuring a temperature of a semiconductor layer during deposition in a chamber, comprising:

applying a first wavelength light and a second wavelength light to the semiconductor layer along a common path, the first wavelength light being a laser beam of a first wavelength and emitted from a first laser beam source, the second wavelength light being a laser beam of a second wavelength that is different from the first wavelength, and the second wavelength light is emitted from a separate second laser beam source, wherein transmittance of the first wavelength light to the semiconductor layer starts to decrease as the temperature of the semiconductor layer rises and reaches a lower end of a first temperature range and stops to decrease at an upper end of the first temperature range, while transmittance of the second wavelength light to the semiconductor layer starts to decrease as the temperature of the semiconductor layer rises and reaches a lower end of a second temperature range that is higher than the first temperature range, and detecting quantities of the first wavelength light and the second wavelength light with a light detecting device facing the semiconductor layer, wherein measurement is performed after the detected quantity of the second wavelength light starts to decrease after the temperature of the semiconductor layer exceeds the upper end of the first temperature, the temperature of the semiconductor layer within the second temperature range is calculated from the detected quantity of the second wavelength light at the time of measurement and a decrease in the detected quantity of the first wavelength light during the first temperature range.

2. The method for measuring a temperature of a semiconductor layer according to claim 1, wherein the current temperature of the semiconductor layer is calculated such that (a maximum temperature of the second temperature range)+(a temperature difference of the second temperature range)×{(a decrease in the detected quantity of the second wavelength light from a decrease starting point to a current point)/(the decrease in the detected quantity of the first wavelength light)}.

3. The method for measuring a temperature of a semiconductor layer according to claim 1, wherein a temperature of the semiconductor layer during deposition is calculated from the current detected quantity of the second wavelength light acquired during deposition of the semiconductor layer onto the substrate, and the decrease in the detected quantity of the first wavelength light, and where a heating temperature of the substrate is controlled to keep the calculated temperature within the second temperature range.

4. The method for measuring a temperature of a semiconductor layer according to claim 1, wherein when the semiconductor layer is being deposited on the substrate with source molecules supplied onto a heated transparent substrate in the chamber, the first wavelength light and the second wavelength light are applied to a surface of the semiconductor layer and a diffuse reflected light passing through the semiconductor layer and a diffuse reflected light reflected from the surface of the semiconductor layer are detected with the light detecting device facing the surface of the semiconductor layer.

5. The method for measuring a temperature of a semiconductor layer according to claim 1, wherein the temperature of the semiconductor layer is also measured by detecting an infrared light emitted from the semiconductor layer with a temperature change measuring device, and a measurement error of the temperature change measuring device is corrected based on the calculated current temperature within the second temperature range.

6. A temperature measuring method for measuring a temperature of a semiconductor layer during deposition in a chamber, comprising:

applying a first wavelength light and a second wavelength light to the semiconductor layer along a common path, the first wavelength light being a laser beam of a first wavelength and emitted from a first laser beam source, the second wavelength light being a laser beam of a second wavelength that is different from the first wavelength and the second wavelength light is emitted from a separate second laser beam source, wherein transmittance of the first wavelength light to the semiconductor layer starts to decrease as the temperature of the semiconductor layer rises and reaches a lower end of a first temperature range and stops to decrease at an upper end of the first temperature range, while transmittance of the second wavelength light to the semiconductor layer starts to decrease as the temperature of the semiconductor layer rises and reaches a lower end of a second temperature range that is higher than the first temperature range, and detecting quantities of the first wavelength light and the second wavelength light with a light detecting device facing the semiconductor layer, wherein when a change in the detected quantity of the second wavelength light is observed by monitoring the detected quantity of the second wavelength light after the temperature of the semiconductor layer exceeds the upper end of the first temperature range, whether the change in the detected quantity of the second wavelength light is due to a change in the temperature of the semiconductor layer or other factors is determined based on a change in the detected quantity of the first wavelength light within the second temperature range.

7. The method for measuring a temperature of a semiconductor layer according to claim 6, wherein when a change in the detected quantity of the first wavelength light is observed along with the change in the detected quantity of the second wavelength light, it is determined that the change in the detected quantity of the second wavelength light is due to a factor other than a change in the temperature of the semiconductor layer.

8. The method for measuring a temperature of a semiconductor layer according to claim 7, wherein a surface roughness of the semiconductor layer is calculated from at least one of the change in the detected quantity of the first wavelength light or the change in the detected quantity of the second wavelength light.

9. The method for measuring a temperature of a semiconductor layer according to claim 6, wherein when a change in the detected quantity of the first wavelength light is not observed along with the change in the detected quantity of the second wavelength light, it is determined that the change in the detected quantity of the second wavelength light is due to a change in the temperature of the semiconductor layer.

10. The method for measuring a temperature of a semiconductor layer according to claim 6, wherein when the semiconductor layer is being deposited on the substrate with source molecules supplied onto a heated transparent substrate in the chamber, the first wavelength light and the second wavelength light are applied to a surface of the semiconductor layer and a diffuse reflected light passing through the semiconductor layer and a diffuse reflected light reflected from the surface of the semiconductor layer are detected with the light detecting device facing the surface of the semiconductor layer.

* * * * *